(12) United States Patent
Oka et al.

(10) Patent No.: US 9,069,634 B2
(45) Date of Patent: *Jun. 30, 2015

(54) SIGNATURE REPRESENTATION OF DATA WITH ALIASING ACROSS SYNONYMS

(75) Inventors: Anand Ravindra Oka, Waterloo (CA); Christopher Harris Snow, Kitchener (CA); Sean Bartholomew Simmons, Waterloo (CA); Ghasem Naddafzadeh Shirazi, Vancouver (CA)

(73) Assignee: BlackBerry Limited, Waterloo (CA)

( * ) Notice: Subject to any disclaimer, the term of this patent is extended or adjusted under 35 U.S.C. 154(b) by 551 days.

This patent is subject to a terminal disclaimer.

(21) Appl. No.: 13/416,589

(22) Filed: Mar. 9, 2012

(65) Prior Publication Data

US 2013/0238681 A1    Sep. 12, 2013

(51) Int. Cl.
*G06F 7/58* (2006.01)
(52) U.S. Cl.
CPC ............................ *G06F 7/58* (2013.01)
(58) Field of Classification Search
None
See application file for complete search history.

(56) References Cited

U.S. PATENT DOCUMENTS

| 8,106,828 | B1 | 1/2012 | Do et al. | |
| 2002/0165912 | A1* | 11/2002 | Wenocur et al. | 709/203 |
| 2002/0194501 | A1* | 12/2002 | Wenocur et al. | 713/201 |
| 2004/0205509 | A1 | 10/2004 | Lou | |
| 2005/0176442 | A1 | 8/2005 | Ju et al. | |
| 2005/0246334 | A1 | 11/2005 | Tao | |
| 2006/0019679 | A1 | 1/2006 | Rappaport et al. | |
| 2006/0050870 | A1* | 3/2006 | Kimmel et al. | 380/30 |
| 2006/0183450 | A1 | 8/2006 | Cameron | |
| 2007/0005589 | A1 | 1/2007 | Gollapudi | |
| 2007/0139269 | A1 | 6/2007 | Chen et al. | |
| 2008/0004036 | A1 | 1/2008 | Bhuta et al. | |
| 2008/0076430 | A1 | 3/2008 | Olson | |
| 2008/0176583 | A1 | 7/2008 | Brachet et al. | |
| 2008/0186234 | A1 | 8/2008 | Alles et al. | |
| 2009/0109095 | A1 | 4/2009 | Hido et al. | |
| 2009/0210418 | A1 | 8/2009 | Arasu et al. | |
| 2010/0094840 | A1 | 4/2010 | Donnelly et al. | |
| 2010/0171993 | A1 | 7/2010 | Longobardi | |
| 2011/0269479 | A1 | 11/2011 | Ledlie | |

FOREIGN PATENT DOCUMENTS

| WO | 0034799 A1 | 6/2000 |
| WO | 2005062066 A2 | 7/2005 |
| WO | 2006117587 A1 | 11/2006 |

OTHER PUBLICATIONS

Barker Brettell, Response to Extended European Search Report dated Dec. 7, 2012, filed in European Patent Application No. 12158952.7-1229.

(Continued)

*Primary Examiner* — Michael D Yaary
(74) *Attorney, Agent, or Firm* — Ridout & Maybee LLP

(57) ABSTRACT

A system and method for generating an m-dimensional signature vector with aliasing across synonyms in a computing device is provided. Data representable by a plurality of key-value pairs, each comprising a unique identifier and an associated non-zero value of n-dimensional data is received at the computing device. Elements of the m-dimensional aliased signature vector are generated using synonym information of keys from the plurality of key-value pairs.

27 Claims, 12 Drawing Sheets

(56) References Cited

OTHER PUBLICATIONS

Haiying Shen et al, Locality Sensitive Hashing Based Searching Scheme for a Massive Database, SouthEastcon, 2008, IEEE, Piscataway N.J., USA, Apr. 3, 2008, pp. 123-128. XP031245568.

Extended Search Report dated Jul. 31, 2012 for corresponding European Patent Application No. 12158952.7.
United States Patent and Trademark Office, Office Action dated Oct. 11, 2013, issued in U.S. Appl. No. 13/416,538.
Norton Rose Fulbright, Response to Office Action filed Jan. 3, 2014 in U.S. Appl. No. 13/416,538.

* cited by examiner

500

|  | Jumped | Skipped | Hopped |
|---|---|---|---|
| Jumped | 1 | 1 | 0.5 |
| Skipped | 1 | 1 | 0.5 |
| Hopped | 0.5 | 0.5 | 1 |

SIGNATURE REPRESENTATION OF DATA WITH ALIASING ACROSS SYNONYMS

TECHNICAL FIELD

The current application relates to systems, devices, and methods of generating signatures of data, and in particular to generating signatures of data utilizing aliasing across synonyms present in the data.

BACKGROUND

The data produced by an information source may be viewed as a random realization produced from a certain probability distribution that is a unique characteristic of that particular source. Different sources will produce realizations of the data from distinct underlying probability distributions.

An information source is said to be producing sparse data if a typical realization of its data, when transformed by a fixed orthonormal transformation that is a characteristic property of that source, consists of only up to s non-zero values. The source is then said to be "s-sparse under that orthonormal transformation" or "s-sparse in the basis of that orthonormal transformation". As a special case, a source can be sparse under the identity orthonormal transformation, which leaves the data unchanged, and in such a case the source is said to be "s-sparse its own domain".

For example, if the source produces vectors of dimensionality 10000, that is, vectors having 10000 elements, but a typical realization of the vector has only up to 10 elements with a non-zero value, then that source may be considered to be sparse, or more accurately 10-sparse, in its own domain. On the other hand if a typical realization of the vector, when transformed by the Fourier transform, has only up to 10 non-zero entries, then the source is said to 10-sparse in the Fourier or frequency domain. It is important to note that it is generally not known a-priori which elements of a realization, in its own domain or after a fixed transformation, will be non-zero. It also may not always be known a-priori what the associated orthonormal transformation is. Typically, only the sparsity of the source, s, or at least an upper bound on it, is known with some certainty.

Although sparsity is, strictly speaking, a property of a random information source, it is an accepted terminology in the field to say that its data is sparse, where the data is implicitly presumed to be a random variable. It is not meaningful to talk of the sparsity of a single deterministic realization of data, since any deterministic realization is always sparse in its own basis.

A characteristic of sparse data is that it may be easily compressed and used as a signature of the data for data analysis purposes. Data may also include repetitive or synonymous information resulting in increased memory requirements and computations required to generate the signature. It is desirable to have a technique for generating a compressed representation of high dimensionality data that does not require a large memory allocation to pre-calculate and store data required to generate the signature and in particular to a technique that utilizes the properties of the synonymous information therein.

Therefore there is a need for an improved method and computing device for signature representation of data with aliasing across synonyms.

BRIEF DESCRIPTION OF THE FIGURES

Further features and advantages of the present disclosure will become apparent from the following detailed description, taken in combination with the appended drawings, in which:

FIG. 5 depicts an illustrative synonym matrix that may be used in generating compressive sensing signatures with aliasing;

DETAILED DESCRIPTION

Figure 1:
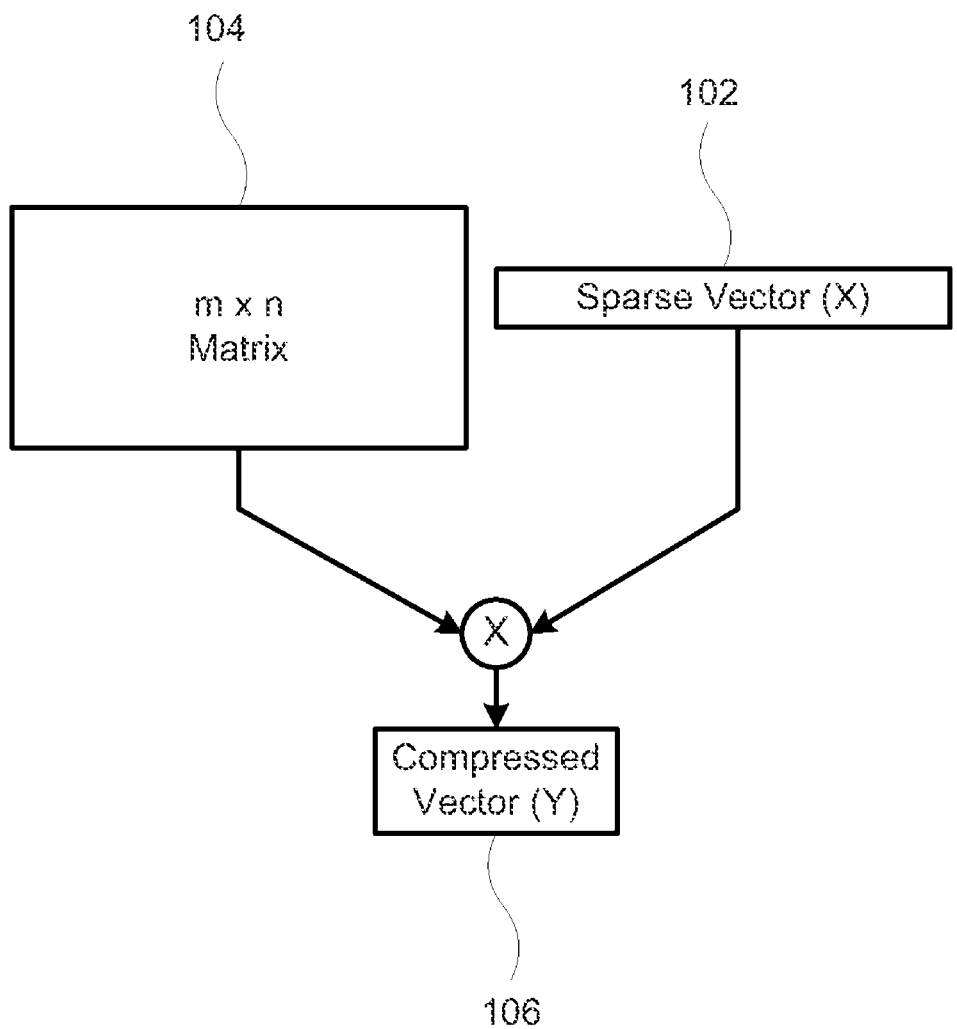
FIG. 1 depicts schematically a method of compressing sparse data, called compressive sensing.

In accordance with an aspect of the present description there is provided a method for generating, in a computing device, an m-dimensional aliased signature vector comprising m vector elements, the method comprising: accessing a plurality of key-value pairs, each comprising a respective key, corresponding to one of n unique identifiers, and a non-zero value, at least one of the keys being associated with one or more synonymous unique identifiers from the n unique identifiers; and calculating each vector element based on a summation of a plurality of terms, each term calculated from a respective key-value pair, when the key of the respective key-value pair is associated one or more synonymous unique identifiers, the term calculated by adding one or more sub-terms, each calculated from a respective synonymous unique identifier of the one or more synonymous unique identifiers associated with the key of the respective key-value pair by: generating a synonym seed based on the respective synonymous unique identifier and the element identifier associated with the vector element being calculated; generating a synonym pseudo-random number from the generated synonym seed; and multiplying the synonym pseudo-random number by the value of the respective key-value pair; wherein m<<n.

In accordance with an aspect of the present description there is provided a computing device for generating an m-dimensional aliased signature vector, the device comprising: a memory containing instructions; and a processor for executing instructions, the instructions when executed by the processor configuring the device to provide functionality for: accessing a plurality of key-value pairs, each comprising a respective key, corresponding to one of n unique identifiers, and a non-zero value, at least one of the keys being associated with one or more synonymous unique identifiers from the n unique identifiers; and calculating each vector element based on a summation of a plurality of terms, each term calculated from a respective key-value pair, when the key of the respective key-value pair is associated one or more synonymous unique identifiers, the term calculated by adding one or more sub-terms, each calculated from a respective synonymous unique identifier of the one or more synonymous unique identifiers associated with the key of the respective key-value pair by: generating a synonym seed based on the respective synonymous unique identifier and the element identifier associated with the vector element being calculated; generating a synonym pseudo-random number from the generated synonym seed; and multiplying the synonym pseudo-random number by the value of the respective key-value pair; wherein m<<n.

In accordance with an aspect of the present description there is provided a computer readable memory containing instructions for generating an m-dimensional signature vector comprising m vector elements, the instructions which when executed by a processor perform the method of: accessing a plurality of key-value pairs, each comprising a respective key, corresponding to one of n unique identifiers, and a non-zero value, at least one of the keys being associated with one or more synonymous unique identifiers from the n unique identifiers; and calculating each vector element based on a summation of a plurality of terms, each term calculated from a respective key-value pair, when the key of the respective key-value pair is associated one or more synonymous unique identifiers, the term calculated by adding one or more sub-terms, each calculated from a respective synonymous unique identifier of the one or more synonymous unique identifiers associated with the key of the respective key-value pair by: generating a synonym seed based on the respective synonymous unique identifier and the element identifier associated with the vector element being calculated; generating a synonym pseudo-random number from the generated synonym seed; and multiplying the synonym pseudo-random number by the value of the respective key-value pair; wherein m<<n.

FIG. 1 depicts schematically a recent method of compressing sparse data, called compressive sensing, or compressed sensing. In compressive sensing, a sparse data vector (X) 102 of dimensionality n is multiplied by a measurement matrix ($\Phi$) 104 having dimensions m×n to generate a compressed vector Y 106 of dimensionality m, where m<<n. That is:

$$Y = \Phi X \quad (1)$$

In order to generate the compressed vector Y, the measurement matrix $\Phi$ must be known in its entirety. The entries of $\Phi$ are drawn as independent identically distributed Gaussian random variables of zero mean and unit variance. In compressive sensing, the entries of $\Phi$ are statistically independent of each other and of the data being compressed, namely the sparse vector X. According to compressed sensing, the original vector X can be reconstructed from the compressed vector Y, with an acceptable error, by 'inverting', or undoing, the multiplication operation of $\Phi$, provided the number of compressive sensing measurements is O(s), where s is the sparsity of X and the orthonormal transformation under which the data is sparse is known to the reconstructor. Specifically, there are reconstruction theorems that guarantee perfect reconstruction with high probability when m>=4s is satisfied.

Compressive sensing may work well in many applications. However, the requirement that the measurement matrix $\Phi$ be known a-priori and have dimensions dependent upon the dimensions of the sparse vector X makes the application of compressed sensing impractical, or even impossible for high-dimensionality sparse vectors. For example, the measurement matrix $\Phi$ necessary to compute the compressed vector Y for a sparse vector X that has $2^{64}$ elements would require an unacceptably large amount of memory, in the order of $O(2^{64})$ to store the required measurement matrix $\Phi$. This memory allocation cannot be avoided even in the case where the data of the vector X is sparse in its own domain, because the location of the non-zero entries is unknown a-priori. As such, current compressive sensing techniques are not well suited for generating a compressed vector from high dimensionality sparse vectors.

Compressed sensing can be used to generate a compressed vector from sparse data. However, in applications where the sparse data has high dimensionality, the size of the required measurement matrix used in generating the compressed vector can be prohibitively large. As described further herein, it is possible to generate a signature of high-dimensionality data without requiring the measurement matrix be known a-priori. As such, it is possible to practically generate a signature for data having a high dimensionality The process described herein is not considered to be compressive sensing as generally applied, since a measurement matrix that is statistically independent from the data is not used in calculating the compressed vector. The generated compressed vector is intended to be used as a signature of the sparse data, and as such, the reconstruction of the original data from the compressed data is not of great concern. Although not considered compressive sensing, the technique is based generally on compressive sensing techniques and as such is referred to as a compressive sensing signature herein.

A compressive sensing signature may be generated from any data, whether it is sparse or not, that is representable by a set of key-value pairs. For example, the data used to generate the compressive sensing signature may be a vector of dimension n, in which case the set of key-value pairs have the non-zero elements of the vector as values, and the associated indices of such values as the keys. Note that this representation is always possible irrespective of whether the data vector is sparse or not. If the vector is s-sparse in its own domain the s non-zero elements, then the number of key-value pairs in the set will also be s. However if the vector is s-sparse under some other non-trivial orthonormal transformation, then the resulting set of key-value pairs can be larger, or smaller, than s.

As an example, the data may be a file comprising of a plurality of tokens, such as words in a text document. Such data may be represented as a plurality of key-value pairs, where a key is a token and its value is the frequency of occurrence of that token in the data. This key value representation need not be unique if repeated keys are allowed in the computation of the compressive sensing signature. For example a token than appears three times can be represented by a single key-value pair, with key=token and value=3, or three key-value pairs with key=token and value=1. The latter representation, with repeated keys, is useful when it is desired to calculate signature of a file incrementally in a single pass without having to make a prior pass to calculate the token-frequency pairs.

In many cases the data may be generated directly in the form of key-value pairs and no further modification of the data is necessary. For example, the data may the radio scene of all Wi-Fi points or cell towers visible to a hand held device, where each key-value pair may consist of MAC address or other unique identifier of a visible radio transmitter as the key, and the received signal strength as the value.

Redundancy may be present in data, with regards to the context of the data being represented, when synonyms or key value pairs that, although not identical, would be characterized as conveying synonymous content. The generation of the compressive sensing signatures as described herein exploits similarities between two, or more, elements of the sparse data. As described further below, the compressive sensing signatures may be generated taking in to account the similarity between elements of the sparse data. For example, if the sparse data represents the frequency of words in documents, it may be desirable to generate the compressive sensing signature taking into account synonyms of words. That is, if one document contains the string "The cow jumped over the moon" and the second document contains the string "The cow hopped over the moon", it may be desirable for both documents to result in the same signature. It is possible to modify the generation of the compressive sensing signatures to take into account the fact that "jumped" may be synonymous with "hopped".

Generating the compressive sensing signatures with aliasing is described further below illustratively with respect to document classification. However, the aliasing may be applied to different applications. For example, if the sparse data comprises MAC addresses, or other unique identifiers, of a wireless device such as in a Wi-Fi network, and the received signal strength of networks seen by a device, different MAC addresses, or other unique identifiers, which are known to be located in the same, or similar, physical locations, then it may be desirable for the similarly located MAC addresses, or other unique identifiers, to generate similar compressive sensing signatures.

When generating compressive sensing signature vectors with aliasing, it is necessary to have some indication of the similarity between elements within the sparse data space. For example, continuing with the string example above, it is necessary to know that "jumping" is synonymous with "hopping".

A compressive sensing signature vector comprises m elements. The number of elements, m, may be determined based on the dimensionality of the data, and the expected sparsity of the data. As an example, m=32 may provide an acceptable signature in numerous application, although other signature sizes are possible such as 64, 128, 256. Each of the m elements of the compressive sensing signature vector is equal to a summation of one or more terms. Each of the one or more terms in the summation of an element is associated with a respective key-value pair of the key-value pairs for which the signature is being generated, and is equal to, or proportional to if a weighting factor is used, the value of the pair multiplied by a pseudo-random number. Each of the pseudo-random numbers used in calculating the terms of the summation are generated from a seed based on the key of the key-value pair of the summation term being generated, and a unique value associated with the element of the signature being calculated, which may be the index of the signature element being calculated. As described further below, it is possible to generate the compressed sensing signature vector in various ways that may or may not require explicitly having a set of key-value pairs with non-repeating keys.

Figure 2:
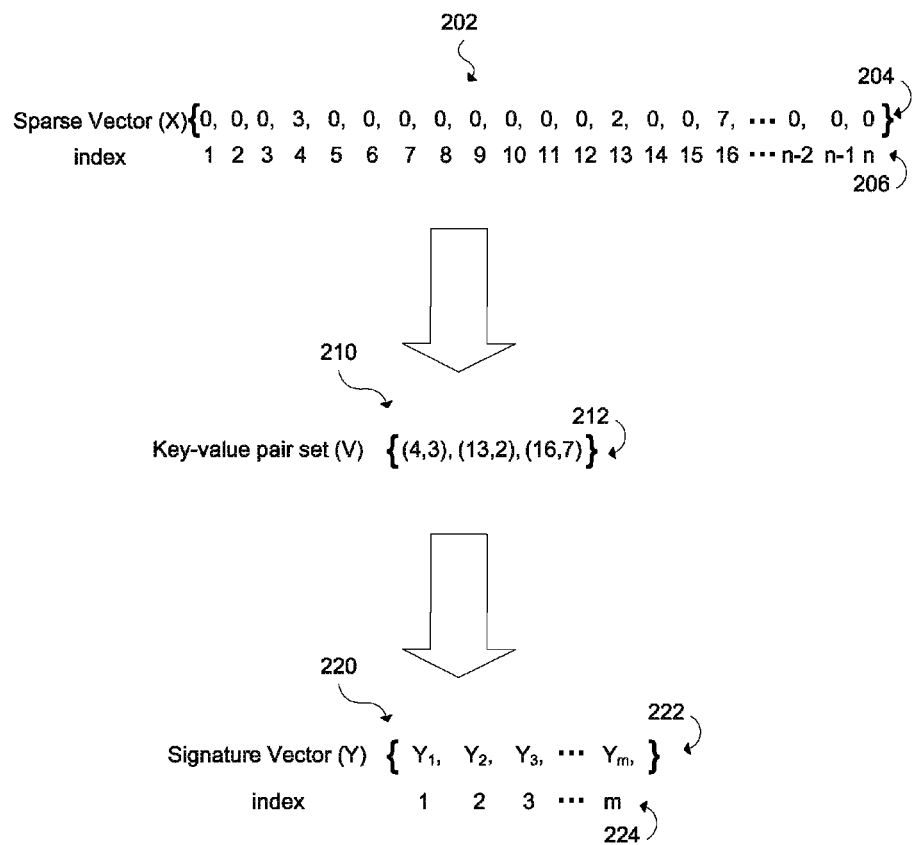
FIG. 2 depicts the various data elements in the compressive sensing signature technique.

FIG. 2 depicts the various data elements in the compressive sensing signature technique as applied to data presented in the form of a vector sparse in its own domain. Note, however, that the described technique may remain applicable even to data that is a vector sparse under some non-trivial orthonormal transformation, or even to a vector that is not sparse at all.

As depicted, there are three types of variables, namely a sparse data vector (X) 202, a set of key-value pairs (V) 210, and the compressed signature vector (Y) 220. The sparse data vector X has n elements 204, each of which may be associated with a respective index 206 or other unique identifier. The sparse vector X may represent various types data, for example, X could be used to represent a text document. In such a case, each index 206 could be associated with a unique word of a dictionary, and the value of the element could represent the number of times the particular word appears in the text document. As will be appreciated, the number of unique words in a language is quite large, and as such the number of elements in the vector X, which would be equal to the number of words, is also large. However, the number of different words used in any particular document is typically only a small subset of the complete language and as such most of the elements of the vector X will be zero-valued.

The set of key-value pairs V 210 comprises key-value pairs 212 of the non-zero elements of the sparse vector X. Continuing with the text document example, each key-value pair in V is associated with a unique word appearing in the text document. The key-value pairs 212 include the non-zero elements from the sparse vector X 202. The key of the key-value pair is the index of a non-zero element of X, that is the key is a unique identifier from the n-dimensional data space, alternatively the key may be the unique word or other identifier associated with the index. The associated value of the key-value pair is the value of the associated element of X. In the text document example the value could be the frequency of occurrence of the unique word in the text document. As can be seen, the number of key-value pairs in the set V is equal to the sparsity of X, that is the number of non-zero elements of X assuming non-repeating keys in the set, which for sparse data will be much smaller than the dimension of X.

The above has assumed that the set of key-value pairs V does not have repeating keys. However, as described further herein it is possible to generate a compressive sensing signature vector from a set of key-value pairs having repeated keys. For example a document comprising the string "example example example" may be represented by the non-repeating key-value pair set {("example", 3)}. Alternatively the document could be represented by the set of key-value pairs, having repeated keys, of {("example", 1), ("example", 1), ("example", 1)}. The same compressive sensing signature vector can be generated from the key-value pairs of either representation.

The signature vector Y 220 comprises a number (m) of elements, with m<<n, n is the dimensionality of X, or the size of an alphabet the possible unique IDs can be drawn from. Each element 222 of the signature vector Y is associated with an index value 224. The value of each element 222 is calculated based on the key-value pairs in the set V, as opposed to the sparse vector X, as described further below.

As should be clear, an actual sparse vector X does not need to be provided to determine the key-value pair set V. Using the text document example of above, a vector having zero values for all the words not in the document does not need to be constructed or provided. Rather, the key-value pair set V can be constructed from the text document directly, for example by counting the occurrence of the different words, and associating the determined frequency of occurrence with each of the unique words present in the document or simply generating a new key-value pair for each word in the document if repeated keys are allowed. It is not necessary to associate a separate index value with a unique word, rather the byte-value of a word can itself be used as the index or key of the word. Thus it is not necessary to use a look up table to translate from a word to an integer index. All that is required is that the key of an entity or token be some unique identifier of that entity or token. Further, since the compressive sensing signature vector may be generated using a set of key-value pairs having repeated keys, it may be possible to generate the compressive sensing signature vector directly from the document without having to generate a set of key-value pairs having non-repeating keys. Thus the representation X and/or V can often be only conceptual, and actual calculation of the signature vector can be done from the data in its raw form, for example a document stored in memory. Returning to the example of the text document, the text document itself may be considered as the set of key-value pairs, with repeating keys, where the value associated with each key is assumed to be 1.

Continuing with the example of a text document, if the word "hello" having index 4 appears three times if could be represented as the key-value pair (4,3) or ("hello",3). It is also possible to represent it as three repeated key-value pairs: (4,1),(4,1),(4,1). The compressive sensing signature vector generated from either representation will be identical. The latter representation has the advantage that it is not necessary to make a prior pass on the document to calculate the frequencies of every word. Rather, as described further below, it is possible to directly and incrementally read the document and update all the m signature element values, so that as the document gets processed completely the signature vector Y is ready. This also means that when document is partially processed, say only 90% of it, then the resulting signature is not "far" from the final answer in a mathematical sense, and can be put to good use. This property itself can be very useful in situations when only partial or incomplete data is available. Also, this property means that the signature may be computed in parts, and the parts subsequently combined together.

Each element of the signature vector Y can be directly calculated from the set of key-value pairs V, without requiring the large measurement matrix be known a priori. If the sparse vector X has s(X) non-zero elements, then the set of key-value pairs V provides a list of s(X) key-value pairs of the form (key K,value P). Since the sparsity of X may vary in different realizations of X, the number of key-value pairs in the set V is described as a function of X, namely s(X). Each element of the signature vector may be directly calculated as:

$$Y_i = \sum_{l=1}^{s(X)} R(f(i, K_l)) \cdot P_l \cdot G(K_l) \quad (2)$$

In (2) above, $K_l$ is the key of the $l^{th}$ element's key-value pair in the set V and $P_l$ is the associated value of the $l^{th}$ key-value pair in the set V. $R(f(i,K_l))$ is a value returned from a unit normal (N(0,1)) pseudo-random number generator using a seed of $f(i,K_l)$. It is noted that the pseudo-random number generator will generate the same value when given the same seed value. The function $f(\bullet)$ may be a hash function of the tuple $(i, K_l)$, such as:

$$f(i,K_l)=\text{hash}(str(i)+str(K_l)) \quad (3)$$

In (3) above str(•) and hash(•) may be common functions for generating a string from a variable, and generating a hash from a string respectively. Further the '+' operator may be the concatenation of strings.

The function $G(K_l)$ in (2) above provides an additional gain function, which may be used to provided flexibility, for example by providing flexibility in deprecating certain elements in the key-value pair set V.

From (2) above, it can be seen that each individual element of the signature vector Y is calculated as a summation of terms, with each term of the summation calculated from the value of a respective key-value pair multiplied by a pseudo-random number generated based on the key associated with the respective value and a unique value associated with the respective element of the signature vector being calculated. As depicted above in (2), the unique value associated with the respective element of the signature vector being calculated may be provided by the index of the element being calculated, however other values are possible.

From the above, it is clear that the calculation of the compressed sensing signature vector Y is done without requiring the generation of the measurement matrix Φ, whose size is proportional to the dimensionality of the sparse vector X, which may be extremely large. As such, the large storage requirement for calculating the compressed sensing signature vector is eliminated. Further, the calculation of the compressed sensing signature vector only involves non-zero data, and hence unnecessary multiplication, i.e. multiplication by zero, and calls to the random number generator are avoided, thereby reducing the computational complexity of generating the compressive sensing signature.

Strictly speaking equation (2) above is not an exact implementation of the compressive sensing of equation (1) since the normal variables provided by the pseudo-random number generator are not completely independent of the data as is the case of the measurement matrix Φ. However, given the benefits of the approach described by (2), any dependence of the normal variables on the data may be acceptable. Further the dependency is only via the seed, and hence results in only very low level long range correlations that may be virtually undetectable when using an adequate pseudo-random number generator.

Figure 3:
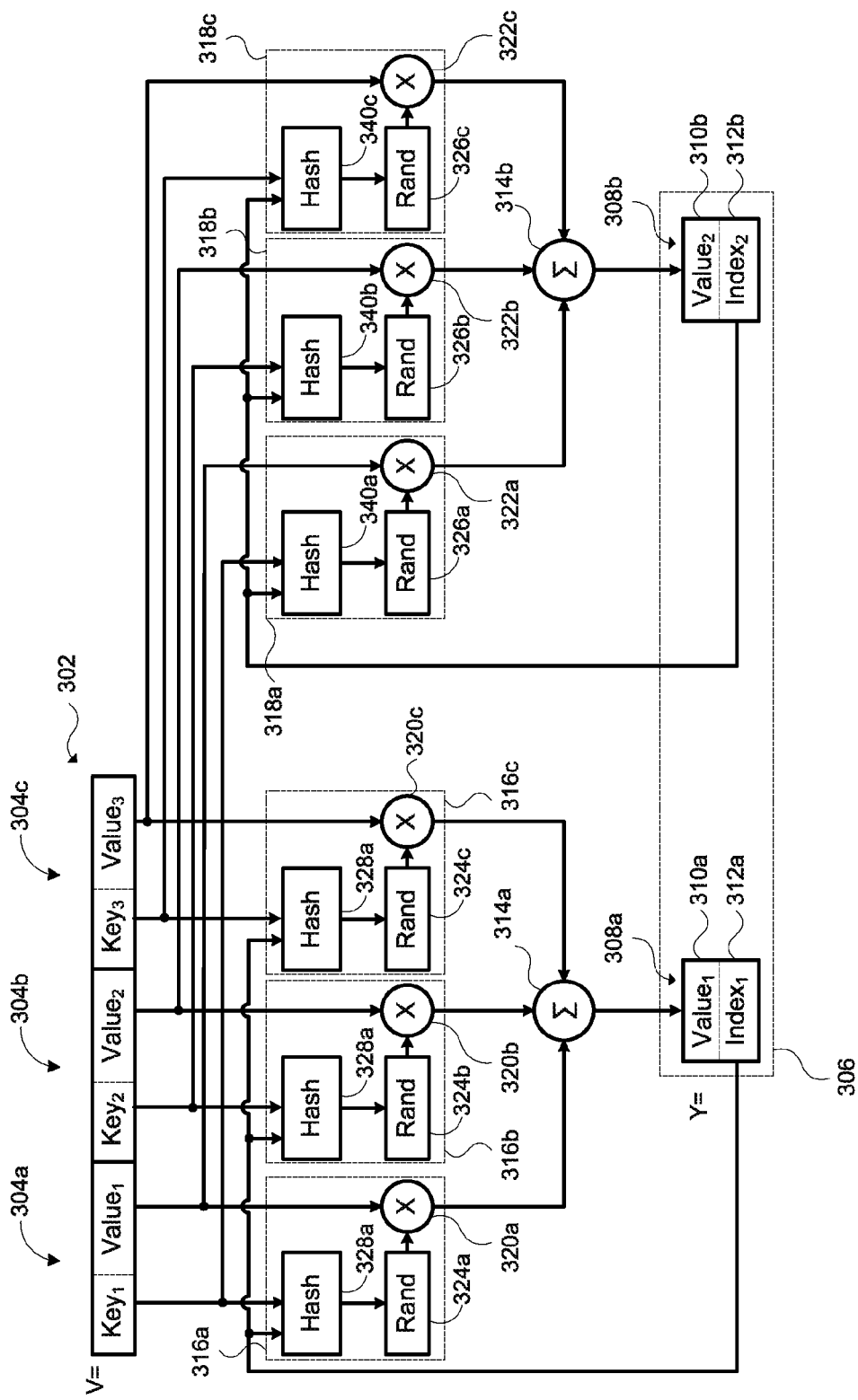
FIG. 3 depicts generating a compressed sensing signature vector.

FIG. 3 depicts generating a compressed sensing signature vector. FIG. 3 depicts calculating a compressed sensing signature vector having two elements. It is contemplated that the length of the signature vector may vary depending upon the application. Different applications may have different dimensions of the sparse vector, as well as different expected sparsities of the data and different probabilities of the possible data. Although different lengths of signatures are possible, a signature of 32 elements may be used as a default size, which is suitable for many applications. As described above, each element of the compressed sensing vector is calculated in the same manner, regardless of if the signature vector has two elements, 32 elements or more.

As depicted in FIG. 3, the key-value pair set V 302 has three elements 304a, 304b, 304c of respective key-value pairs. The compressed sensing signature vector Y 306 is depicted as having two elements 308a, 308b each having a value 310a, 310b and associated index value 312a, 312b.

As is clear from FIG. 3, each value 310a, 310b is calculated as a summation 314a, 314b, of a plurality of terms 316a, 316b, 316c and 318a, 318b, 318c respectively. The number of terms in each summation 314a, 314b is equal to the number of key-value pairs, including repeated keys, in the set V. Each term 316a, 316b, 316c, 318a, 318b, 318c used in the summation may be calculated as a multiplication 320a, 320b, 320c, 322a, 322b, 322c of a respective value of the respective key-value pair 304a, 304b, 304c of the set V and a random number 324a, 324b, 324c, 326a, 326b, 326c generated from a pseudo-random number generator. The pseudo-random number generator may generate each of the random numbers 324a, 324b, 324c, 326a, 326b, 326c using a respective seed value. Each of the seed values 328a, 328b, 328c, 330a, 330b, 330c may be generated from the key of the respective key-value pairs 304a, 304b, 304c of the set V and the respective index 312a, 312b, or unique identifier, of the element of the compressed sensing signature vector being calculated.

The process of FIG. 3 is intended to clarify the conceptual generation of the compressed sensing signature vector, and it should be appreciated that other processes for the generation are possible. For example, each term used in the summation is depicted as being calculated in parallel; however, it is contemplated that the terms could be calculated sequentially. Further, the multiplication of the random numbers by the respective values could be accomplished by adding the random numbers together a respective number of times based on the value.

Figure 4:
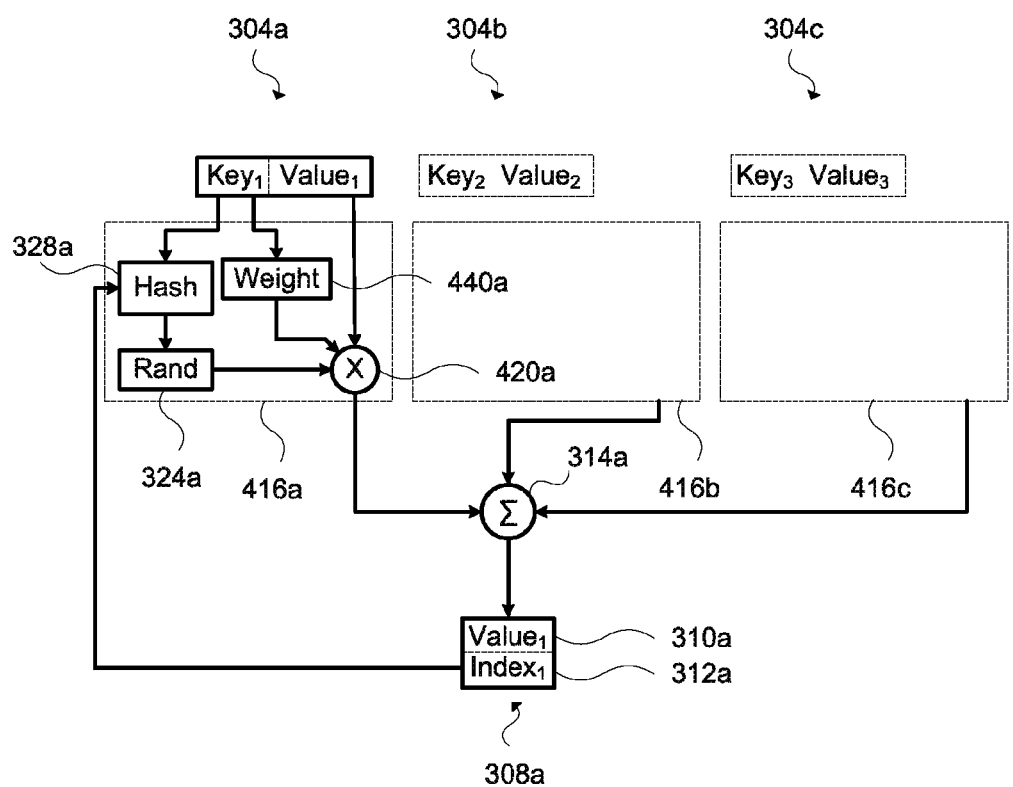
FIG. 4 depicts generating a compressed sensing signature vector.

FIG. 4 depicts generating a compressed sensing signature vector. The process depicted in FIG. 4 is substantially similar to that described above with regards to FIG. 3; however, the calculation of each of the terms 416a, 416b, 416c used in the summation 314a, includes a weighting term 450a (depicted for term 416a only). FIG. 4 only depicts the details for the calculation of a single term 416a used in the summation 314a for a single element 308a in the signature vector. The calculation of the other terms 416b, 416c may also include a similar weighting term.

As depicted in FIG. 4, the term 416a used in the summation 314a is equal to a multiplication 420a of the random number 324a, the value of the key-value pair 304a in the set V and a weighting term 450a. The weighting term 450a may be used to provide a means of providing more relevant terms. For example, if the set of key-value pairs is used to represent the occurrence of words in a document, the weighting term 450a may be a function that provides an indication of the importance of the word. The weighting term 450a may be provided by a weighting function that provides the weighting term based on the index or key of the key-value pair associated with the summation term being calculated.

Various ways of calculating a signature vector have been described. As described further below, it is possible to calculate a signature vector taking into account similarities between terms in the data. In order to generate a signature vector using aliasing across synonym, some form of synonym information identifying the similarity of terms is used.

Figure 5:
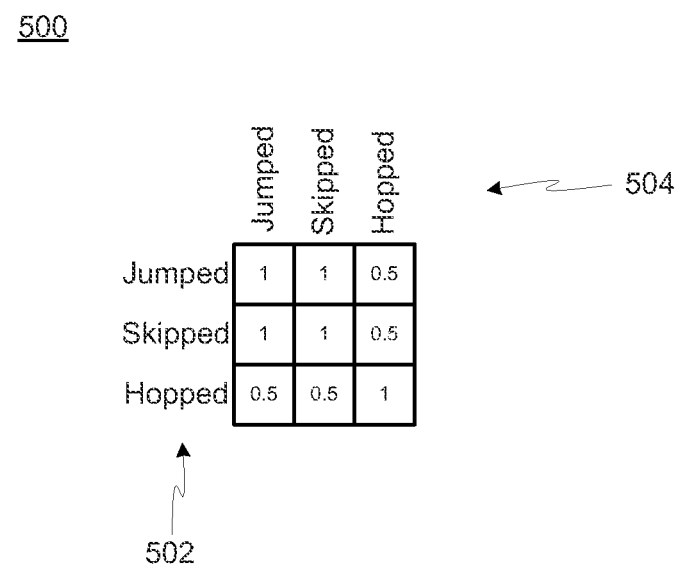

FIG. 5 depicts an illustrative synonym matrix that may be used in generating compressive sensing signatures with aliasing. The synonym matrix 500 provides synonym information and comprises rows 502 and columns 504 for each of the words that have one or more synonyms. Each element of the synonym matrix 500 comprises an indication of the similarity between the word associated with the row and the word associated with the column. In the synonym matrix 500, the words "jumped" and "skipped" are exact synonyms, that is they have a similarity value of 1, while the words "jumped" and "hopped" are not exact synonyms and have a similarity value of 0.5. Similarly, the words "skipped" and "hopped" have a similarity value of 0.5.

Compressive sensing signatures generated using the similarity matrix 500 for the strings "The cow jumped over the moon" and "The cow hopped over the moon" will be identical. The compressive sensing signatures generated using the similarity matrix 500 for the string "The cow jumped over the moon" and "The cow skipped over the moon" will be similar. The generation of compressive sensing signatures with aliasing is described further below.

The synonym information was described with regards to FIG. 5 as being provided by a synonym matrix 500. It will be appreciated that the synonym matrix 500 is only one particular means of storing the synonym information. For example the synonym information could be provided by a plurality of 3-tuples, comprising a first key of an element in the sparse data space, a second key of a synonym or partial synonym of the first key, and a synonym weighting value indicating the similarity between the two elements. Further the synonym information was described with regards to words; however, different types of data may have synonym information. The synonym information may identify, or otherwise associate, a plurality of synonymous keys, or more particularly a plurality of synonymous unique identifiers from the n-dimensional space, that are similar to each other with in a particular context. Given a set of key-value pairs of data being processed, it can be determined if a particular key has associated synonyms by checking if the key matches any of the synonymous keys, or more particularly any of the synonymous unique identifiers.

Generally, a compressive sensing signature (Y) can be generated according to:

$$Y_i = \sum_{l=1}^{S(X)} \in [R(f(i, Q)) | I_l] V_l G(I_l), \text{ for } i = 1, 2, 3, \ldots, m \quad (4)$$

where:

Q is deemed to a random variable dependent on $I_l$. When conditioned on $I_l$, Q gets drawn from the conditional distribution $\mu(\cdot|I_l)$.

$Y_i$ is an element of the compressed sensing signature with aliasing.

S(X) is the sparsity of the data, that is the number of non-zero elements in the data.

R (••) is a random number function.

$I_l$ is a key of an element of the sparse data.

$V_l$ is the value associated with the key $I_l$ $G(I_l)$ is a weighting factor associated with the key $I_l$.

$\in[\cdot|X]$ denotes an expectation with respect to the conditional probability distribution, conditioned on X.

In the above, $\mu(\cdot|a)$ is a synonymity measure between a key a and all the keys in the alphabet of the sparse data space. The measure μ(·|a) takes positive real values and is deemed to add up to one, or some other constant number independent of a.

Figure 6:
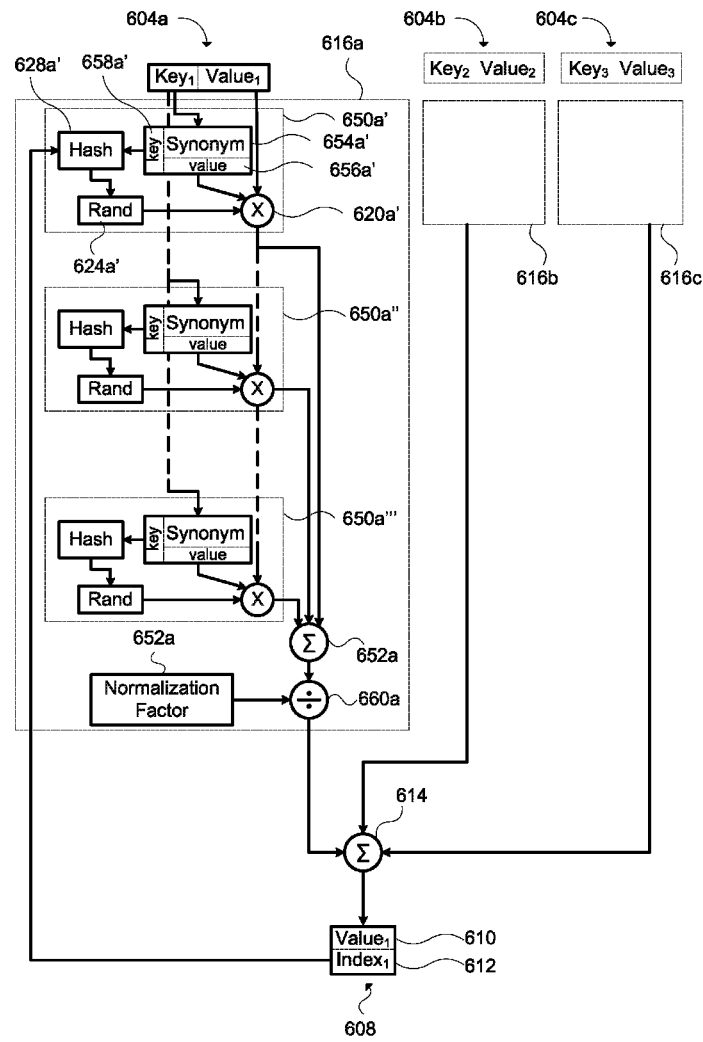
FIG. 6 depicts generating a compressed sensing signature vector using aliasing across synonyms.

FIG. 6 depicts schematically the generation of a compressive sensing signature vector with aliasing. FIG. 6 only depicts the calculation of a single term 616a used in the summation 614 for one element 608 of the signature. Each of the other terms 616b, 616c could be calculated in a similar manner as shown for term 616a. Similar to the above, each term 616a, 616b, 616c corresponds to a key-value pair of the data being processed. Although three key-value pairs are depicted in FIG. 6, it will be appreciated that fewer or additional terms may be used in the summation 614 for the element of the compressive sensing signature depending on the number of key-value pairs in the data being processed.

As described above, and in particular with reference to FIG. 3, each term in the summation of a signature element is determined using a respective key-value pair from the set of key-value pairs. When determining the terms for compressive sensing signatures using aliasing, terms of key-value pairs having no synonym are calculated in the same manner as described above. However, if the key-value pair has one or more synonyms, then the term is calculated as a summation of additional sub-terms calculated based on the synonymous unique identifiers.

The calculation of a term for a key-value pair having associated synonyms is depicted in FIG. 6. As depicted, the term 616a for key-value pairs having synonyms may be calculated as a summation 652a of sub-terms 650a', 650a'', 650a'''. Each of the sub-terms is calculated in a similar manner as described above for the individual terms, however, rather than using the key-value pair, each sub-term 650a', 650a'', 650a''' is calculated using a respective synonym of the key-value pair. As such, the number of sub-terms 650a', 650a'', 650a''' used in calculating the term 616a may be determined based on the number of synonyms that exist for a particular word. Further, when considering synonyms, the key-value pair may be considered to be synonymous with itself.

In describing FIG. 6, it will be assumed that the first key-value pair 604a is provided by the word-frequency of occurrence pair of ("jumped",1). Further, it is assumed that the synonym information is provided by the synonym matrix 500 of FIG. 5. Using the synonym information 500 it would be determined that the key of the key-value pair 604a is associated with synonyms, namely itself, "hopped" and "skipped". The three sub-terms 650a', 650a'', 650a''' correspond to a respective one of the synonyms.

Turning to the calculation of the sub-term 650a', as can be seen, the calculation of the sub-term is similar to the calculation of individual terms 316a described above with reference to FIG. 3, however, instead of using the key of the key-value pair, the key of the synonym is used. It is noted that one of the synonyms would include the key itself. The synonym information is used to determine a key 658a' of the synonym 656a' associated with the key ($Key_1$) of the key-value pair 604a, and a synonym weighting value 656a'. The synonym weighting value 656a' may be used to provide for soft synonyms, that is synonyms that have a similar meaning, but not exact. If the application only requires exact synonyms, the synonym weighting value 656a' does not need to be used as it can be assumed to 1.

Once the key 658a' of the synonym 654a' is determined it may be used to generate a hash value along with the index value 612 of the element 608 of the signature vector being calculated. Similar to the hashes described above, the hash 628a' may be generated using a concatenation of the index value 612 of the signature element and the synonym key 658a'. The generated hash value may then be used to seed a pseudo-random number generator 624a'. The sub-term 650a' is then calculated as the product of the generated pseudo-random number, the synonym weighting value 656a' and the value ($Value_1$) of the key-value pair.

Each of the other sub-terms 650a'', 650a''' may be determined in a similar manner; however, the synonym key values and the synonym weighting values used are associated with different synonyms of the key-value pair. Once the sub-terms 650a', 650a'', 650a''' associated with each synonym are calculated they can be summed together. The sum of the sub-terms 650a', 650a'', 650a''' may then be normalized. The summation may be normalized by dividing 660a the term by a normalization factor 662a. The normalization factor 660a may be equal to the sum of the individual synonym weights. If only exact synonyms are allowed, then each synonym weight will be 1, and the normalization factor reduces to the number of synonym sub-terms. Once the term 616a is determined as the normalized sum of the synonym sub-terms 650a', 650a'', 650a''', it can be summed with the other terms 616b, 616c to provide the element of the signature vector. The other terms 616b, 616c may be calculated in a similar manner as described above with term 616a if the associated key-value pair has synonyms. Alternatively, the terms 616b, 616c may be calculated as described above with reference to FIG. 3 or FIG. 4 if there are no synonyms.

It will be appreciated that the particular calculation of the compressive sensing signature with aliasing described above, is only a single possible way to generate the compressive sensing signature. That is, the particular order of the operations, such as multiplication and addition of the various values can be reordered as well understood, while still providing a compressive sensing signature. Generally, the m-dimensional compressive sensing signature vector with aliasing across synonyms can be determined according to:

$$Y_i = \sum_{l=1}^{S(X)} \frac{\sum_{r=1}^{nS(k_l)} [R(f(i, sk_{rl}))sw_{rl} \cdot p_l \cdot G(k_l)]}{\sum_{r=1}^{nS(k_l)} sw_{rl}}, \text{ for } i = 1, 2, 3, ..., m \quad (5)$$

Where:
$Y_i$ is the $i^{th}$ element of the compressive sensing signature.
S(X) is the sparsity of the data being processed, that is the number of key-value pairs.
$nS(k_l)$ is the number of synonyms associated with the $l^{th}$ key $k_l$ of the key-value pairs.
R(x) is a pseudo-random number generated from a seed x.
$f(i, sk_{rl})$ is a hashing function of the concatenation of i and $sk_{rl}$.
$sk_{rl}$ is the key or unique identifier from the n-dimensional data space associated with the $r^{th}$ synonym of the $l^{th}$ key $k_l$.
$sw_{rl}$ is the synonym weight value associated with the $r^{th}$ synonym of the $l^{th}$ key $k_l$.
$p_l$ is the $l^{th}$ value in the set of the key-value pairs.
$G(k_l)$ is a weighting factor associated with the $l^{th}$ key $k_l$ in the set of the key-value pairs.

Figure 7:
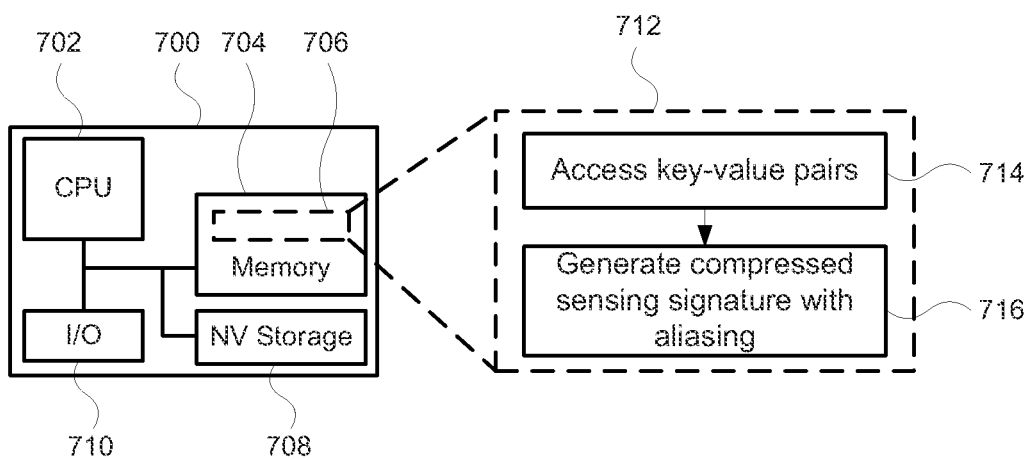
FIG. 7 depicts a device for generating a compressed sensing signature.

FIG. 7 depicts a device for generating a compressed sensing signature with aliasing across synonyms. The device 700 comprises a central processing unit (CPU) 702 for executing instructions and a memory 704 for storing instructions 706. The device may further comprise non-volatile (NV) storage 708 for providing permanent storage of instructions and data.

The device 700 may further comprise an input/output (I/O) interface 710 for connecting one or more input or output devices to the CPU 702.

The instructions 706 stored in memory 704 may be executed by the CPU 702. When the instructions 706 are executed by the CPU 702, they configure the device 700 to provide functionality 712 for generating a compressed sensing signature vector with aliasing across synonyms. The functionality 712 includes functionality for accessing a plurality of key-value pairs (714). The key-value pair each comprise a unique identifier from n-dimensional data as a respective key and an associated non-zero value, at least one of the keys of the plurality of key-value pairs associated with one or more synonymous unique identifiers from the n-dimensional data. The functionality 712 further includes functionality for generating the compressed sensing signature vector with aliasing across synonyms (716). Generating the compressed sensing signature vector with aliasing comprises generating elements of the m-dimensional aliased signature vector, each of the elements generated based on a summation of a plurality of summation terms, each of the summation terms associated with a respective key of the plurality of key-value pairs, a summation term of the summation terms associated with a key having one or more synonymous unique identifiers, and calculated as a summation of sub-terms each associated with a respective one of the one or more synonymous unique identifiers, each of the sub-terms calculated using a pseudo-random number generated from a seed based on the respective synonymous unique identifier and an index or identifier of an element of the m-dimensional aliased signature vector being generated. The functionality for generating the compressed sensing signature vector with aliasing across synonyms may be provided in various ways. One particular way of generating the compressed sensing signature with aliasing across synonyms was described above with regards to FIG. 6. An illustrative method of generating the compressive sensing signature with aliasing is described further below.

The signature processing and generation may be performed on an individual device having one or more processors. The signature processing and generation is scalable to a framework for running applications on large cluster of computing devices or distributed clusters of computing devices. The compressive sensing signature generation described can be divided into many small fragments of work, each of which may be executed or re-executed on any node in a cluster providing very high aggregate bandwidth across the cluster. Similarly the process of comparing or analyzing the generated compressive sensing signature vectors can be performed in a distributed system as well.

Figure 8:
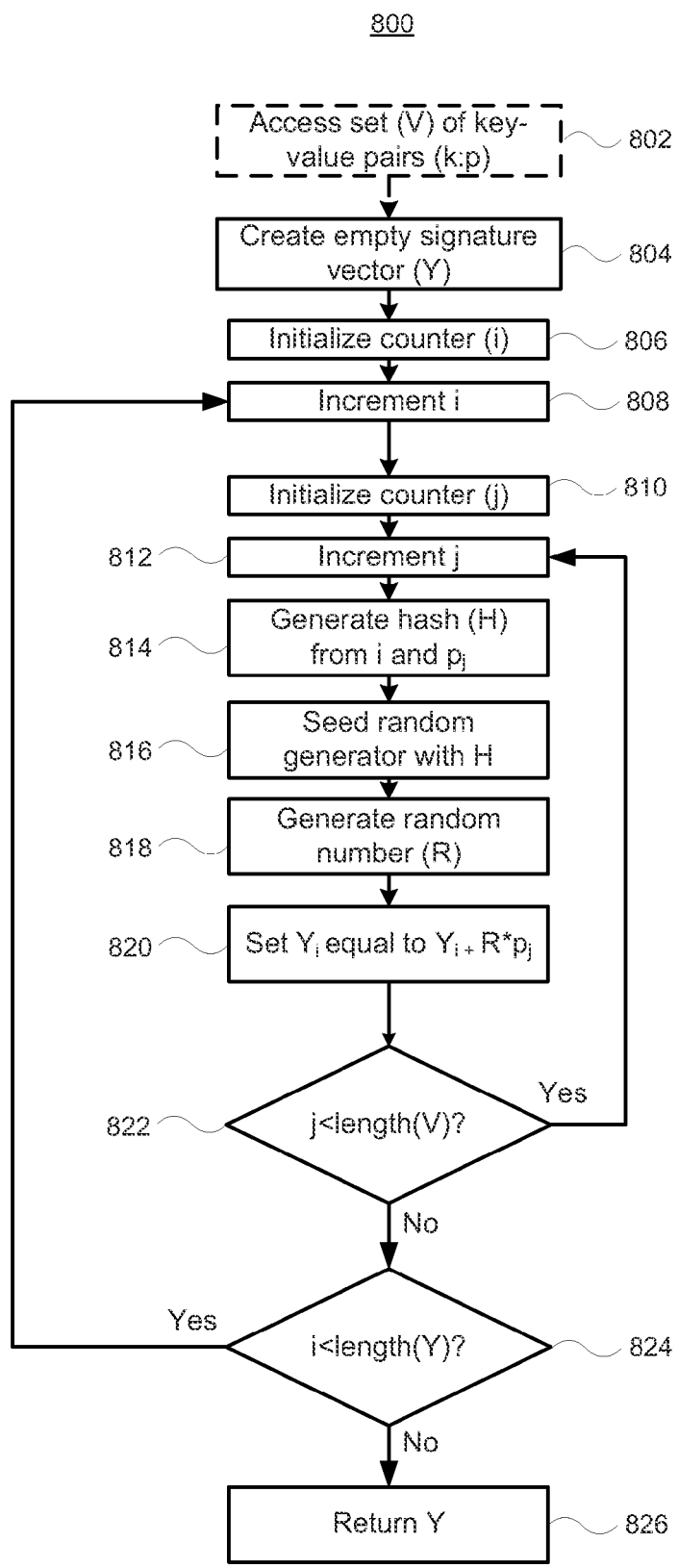
FIG. 8 depicts a method of generating a compressed sensing signature.

FIG. 8 depicts a method of generating a compressed sensing signature vector. The method 800 may be used to generate a compressed sensing signature vector from a set of key-value pairs V. The set V may comprise unique keys, or may have repeated keys. The set V comprises at least one key-value pair, wherein each key is a respective index or identifier of the sparse data and the associated value is a value of the sparse data associated with the respective index or identifier.

The set of key-value pairs V comprising one or more key-value pairs may be accessed (802), which may include receiving or retrieving the data for example from a storage device. The set V has k elements, where k>=1. The method 800 creates an empty signature vector (Y) of m elements (804). The empty signature vector Y has m zero-valued elements. The method initializes a first counter (i) (806). The counter (i) is used to loop over each element in the signature vector Y and calculate the element's value. Once the counter is initialized, it is incremented (808). It is noted that in the method 800 the counter (i) is initialized to one less than the first index of the signature vector Y so that when it is incremented, the first element of the signature vector Y will be referenced. Further, it is noted that the initialization and incrementing of the counter (i) may be done implicitly, for example by using a 'for-next' loop, or other programmatic means. Once the first counter (i) is initialized/incremented, a second counter (j) is similarly initialized (810) and incremented (812). The second counter (j) is used to loop over each element in the set V to calculate the summation terms from the key-value pairs of the set V elements.

Once the second counter (j) is initialized/incremented a hash (H) is generated from the concatenation of the value of the first counter (i) and the key of the $j^{th}$ key-value pair of the set V (814). Once the hash (H) is calculated, it is used as the seed for a random number generator (816), and a random number (R) is generated from the seeded random number generator (818). Once the random number (R) is generated, the $i^{th}$ element of the signature vector V, which was initialized to zero, is set equal to $Y_i+R*p_j$, where $p_j$ is the value of the $j^{th}$ key-value pair of the set V (820). Once the terms have been summed, it is determined if the second counter (j) is less than the number of key-value pairs in the set V (822). If the counter (j) is less than the number of elements in the set V (Yes at 822), then there are further elements in the set V to use in calculating the element in the signature vector Y and the method returns to increment the second counter (j) and proceeds to incorporate the next key-value pair from the set V in the calculation of $Y_i$. If the counter (j) is not less than the number of elements (No at 822), than there are no more key-value pairs in the set V to use in calculating $Y_i$ and the method determines if the first counter (i) is less than the number of elements in the signature vector Y (824). If the counter (i) is less than the number of elements in the signature vector Y (Yes at 824), then there are further elements of the signature vector Y to calculate and the method increments the first counter (i) (810) and calculates the value of the next element of the signature vector Y. If the first counter (i) is not less than the number of elements in the signature vector Y (No at 824), then all of the elements of the signature vector Y have been calculated and the signature vector Y is returned (826).

The method 800 described above may generate a compressed sensing signature vector from a set of key-value pairs representative of sparse data. In certain applications, it is possible to generate the compressed sensing signature vector without requiring that the set of key-value pairs be provided explicitly. For example, if a compressed sensing signature vector is generated for a text document, it is possible to generate the compressed sensing signature vector directly from the text document by treating the individual words in the document as key-value pairs having repeated keys, with each having an associated value of 1. The compressed sensing signature vector can be generated directly from the key-value pairs, with assumed values, in the text document, with the contribution of each word added to the signature vector elements as the text document is processed.

Figure 9:
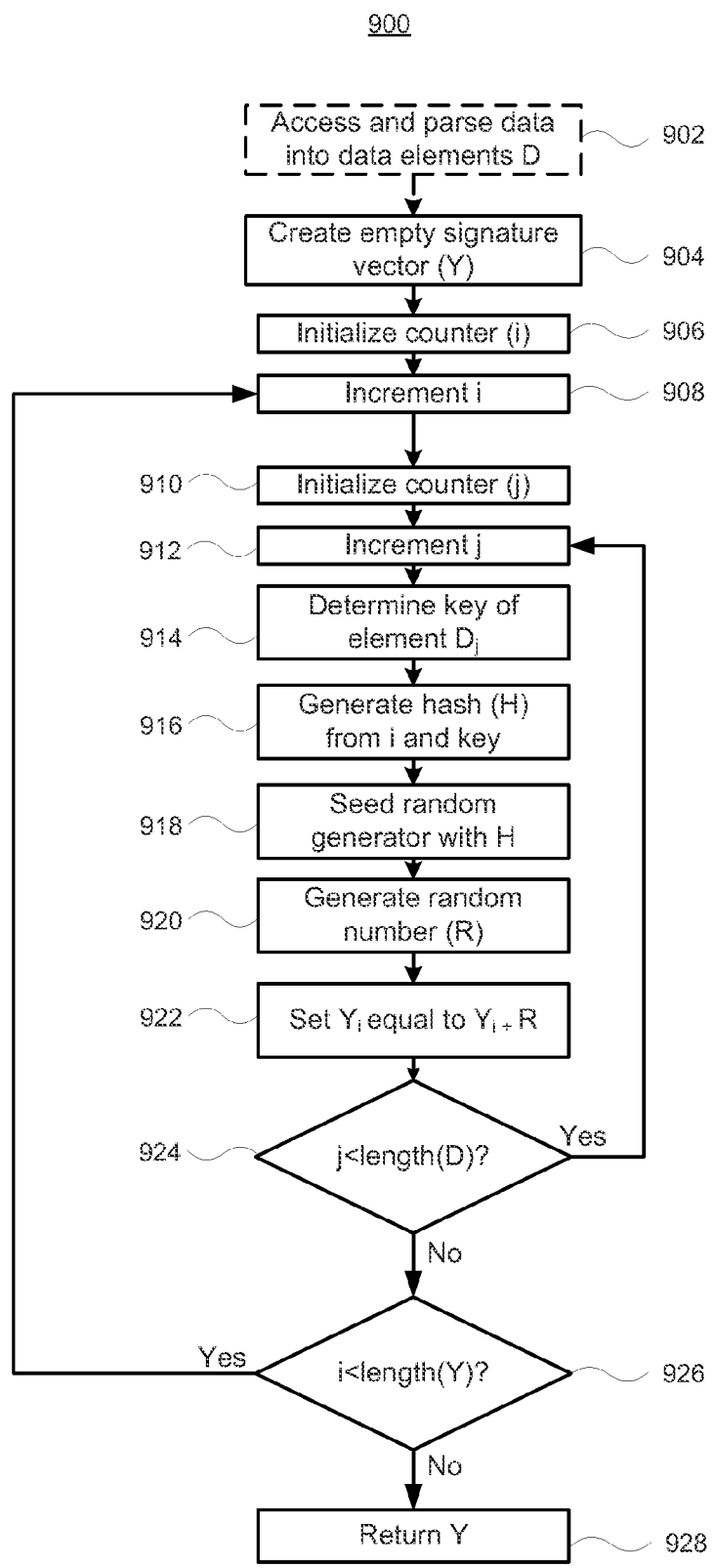
FIG. 9 depicts a further method of generating a compressed sensing signature.

FIG. 9 depicts a further method of generating a compressed sensing signature vector. The method 900 generates a compressed sensing signature vector Y from data that can be represented by a set of key-value pairs each comprising a unique identifier and an associated non-zero value of n-dimensional data. The unique identifier is unique within the n-dimensions; however it may be repeated within the set V. The method 900 begins with accessing the data and parsing the data into a plurality of elements $D_{1...m}$ (902). For example, if the data comprises a text document, it may be parsed into the individual words. It is noted, that the data is described as being parsed completely for the clarity of the description. It is contemplated that as each token of the document is parsed it may be processed. The parsed data may be considered as a set of key-value pairs with each value equal to 1. Next an empty signature vector Y is created (904). A first counter (i) is initialized (906) and incremented (908) to point to a first token in the data. A second counter (j) is then initialized (910) and incremented (912). The first counter (i) is used as an index to the element of the signature vector being calculated and the second counter (j) is used as an index into the received data, for example it may indicate the word being processed. Once the counters are initialized/incremented, a key associated with the parsed data element $D_j$ is determined (914). The key may be determined using a lookup table, or similar structure. Alternatively the key may be determined directly from the data element $D_j$. For example the key could be provided by the byte value of the word being processed. Once the key is determined, a hash (H) is generated from the first counter (i) and the determined key (916). The generated hash (H) is used as the seed to a random number generator (918) and a random number (R) is generated (920). Once the random number (R) is generated, it is used in the calculation of the $Y_i$ element of the signature vector Y. The element $Y_i$ is set equal to the current value of $Y_i$ plus the random number R (922). Next, it is determined if the counter (j) is less than the number of parsed data elements in D (924). If it is (Yes at 924), then there are still more elements in the parsed data D to be processed, and the counter (j) is incremented (912) and the next element in the parsed data D processed. If the counter is not less than the number of parsed data elements D (No at 924), it is determined if the counter (i) is less than the number of elements in the signature vector Y (926) and if it is (Yes at 926), the counter (i) is incremented (908) and the next element of the signature Y calculated. If the counter (i) is not less than the number of elements in Y (No at 926) then all of the elements of the signature vector have been calculated, and the signature vector Y is returned (928).

Figure 10:
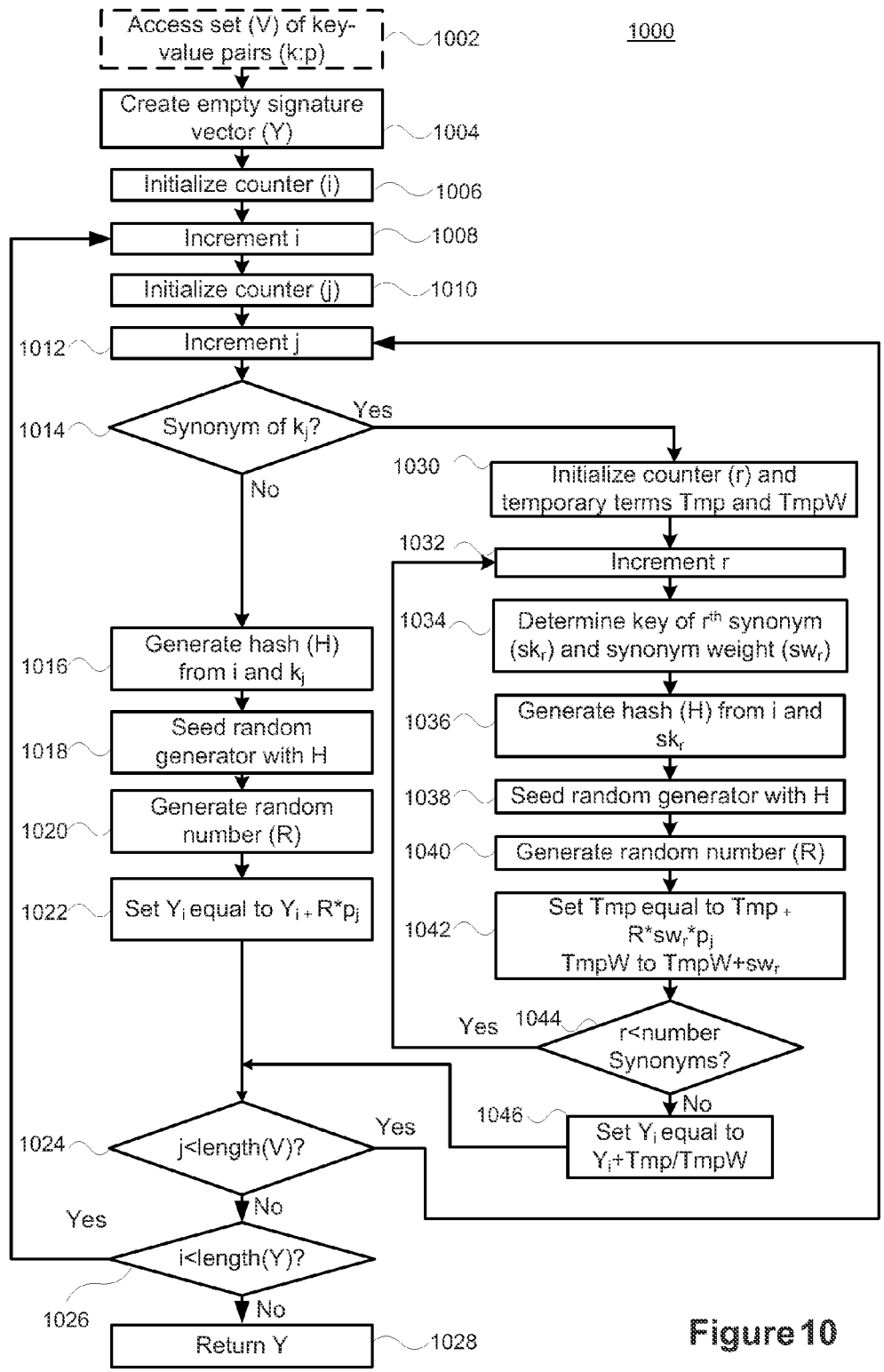
FIG. 10 depicts a method of generating a compressed sensing signature using aliasing across synonyms.

FIG. 10 depicts an illustrative method of generating a compressive sensing signature with aliasing across synonyms. The method 1000 begins when a set of one or more key-value pairs is accessed (1002). The accessed set of key-value pairs may be received or retrieved as a document, such as a text document, as an existing set of key-value pairs or as a sparse vector. The set of key-value pairs has k non-zero elements, where k>=1. The method 1000 creates an empty signature vector (Y) of m elements (1004). The empty signature vector (Y) has m zero-valued elements. The method initializes a first counter (i) (1006). The counter (i) is used to loop over each element in the signature vector (Y) and calculate the element's value. Once the counter is initialized, it is incremented (1008). It is noted that the counter (i) is initialized to one less than the first index of the signature vector (Y) so that when it is incremented, the first element of the signature vector (Y) will be referenced. Further, it is noted that the initialization and incrementing of the counter (i) may be done implicitly, for example by using a 'for-next' loop or other programmatic functionality. Once the first counter (i) is initialized/incremented, a second counter (j) is initialized (1010) and incremented (1012). The second counter (j) is used to loop through each of the key-value pairs in the set to calculate the summation terms associated with the respective key-value pairs.

Once the second counter (j) is initialized/incremented, it is determined if the $j^{th}$ key-value in the set has any synonyms (1014). The determination as to whether there are any synonyms may be made be searching the synonym information for the respective key. If there are no synonyms associated with key (No at 1014) a hash (H) is generated from the concatenation of the first counter (i) and the $j^{th}$ key of the set key-value pairs (1016). Once the hash (H) is calculated, it is used as the seed for a random number generator (1018), and a random number (R) is generated from the seeded random number generator (1020). Once the random number (R) is generated, the $i^{th}$ element of the signature vector Y, which was initialized to zero is set equal to $Y_i+R*p_j$, where $p_j$ is the value of the $j^{th}$ key-value pair in the set of key-value pairs (1022). Once the terms have been summed, it is determined if the second counter (j) is less than the number of pairs in the set of key-value pairs (1024). If the counter (j) is less than the number of pairs in the set, there are further pairs in the set to use in calculating the element in the signature vector (Y). When the counter (j) is less than the number of pairs in the set (Yes at 1024), the method returns to increment the second counter (j) (1012) and proceeds to incorporate the next key-value pair in the set in the calculation of Y. If the counter (j) is not less than the number of key-value pairs in the set (No at 1024), then there are no further pairs in the set to use in calculating $Y_i$ and the method determines if the first counter (i) is less than the number of elements in the signature vector (Y) (1026). If the counter (i) is less than the number of elements in the signature vector (Y) (Yes at 1026), then there are further elements of the signature vector (Y) to calculate and the method increments the first counter (i) (1008) and calculates the value of the next element of the signature vector (Y). If the first counter (i) is not less than the number of elements in the signature vector (Y) (No at 1026), then all of the elements of the signature vector (Y) have been calculated and the signature vector (Y) is returned (1028).

Returning to the determination of if there are any synonyms associated with the $j^{th}$ key (1014), if there are associated synonyms (Yes at 1014), then the element of the signature vector is calculated based on the synonyms. A further counter (r) is initialized along with temporary terms (Tmp) and (TempW) for holding the summation term and the summation of the synonym weights respectively (1030). The counter (r) is used to loop over each of the synonyms associated with the key. The counter (r) is incremented (1032). Once the counter (r) is incremented, the key ($sk_r$) and the synonym weight value ($sw_r$) of the $r^{th}$ synonym is determined (1034). A hash (H) is then generated from the concatenation of the first counter (i) and the key of the $r^{th}$ synonym (1036). Once the hash (H) is calculated, it is used as the seed for a random number generator (1038), and a random number (R) is generated from the seeded random number generator (1040). Once the random number (R) is generated, the temporary terms (Tmp) and (TempW), which were initialized to zero, are set equal to Tmp=Tmp+R*$sw_r$*$p_j$ TempW=TempW+$sw_r$ (1042), where $sw_r$ is the synonym weighting value of the $r^{th}$ synonym and $p_j$ is the value of the $j^{th}$ key-value pair in the set of key-value pairs. It is then determined if the counter r is less than the number of synonyms (1044) and if it is (Yes at 1044) the method returns to increment the counter r (1032). If the counter r is not less than the number of synonyms (No at 1044), then the temporary term (Tmp) is normalized by dividing by the sum of the synonym weights, which is provided by TempW. The $i^{th}$ element of the signature is the set equal to the value of the $i^{th}$ element of the signature plus the normalized temporary term (1046) and the method determines if there are further pairs in the set of key-value pairs (1024).

As described above, a compressed sensing signature may be generated that provides aliasing over synonyms. The compressive sensing signature may be used in various applications as described below.

Let datum $X=\{v_l\}_{l=1}^{S(X)}$ be an English document (X), where $v_l$ is the $l^{th}$ word. Although it is possible to provide approximate or partial synonyms by using different values for the synonym weighting value, for simplicity of this example, it is assumed that a word in English can have only exact synonyms if any. Thus, given an English word a, the measure $\mu(\cdot|a)$ is deemed to be uniform over a and all its synonyms, and zero for all other words. Let $\aleph(a)$ denote the set of synonyms of the word a and $|\aleph(a)|$ be its cardinality. Then the elements of the aliased compressive sensing signature of the document X are given by:

$$Y_i = \sum_{l=1}^{S(X)} \frac{1}{|\aleph(v_l)|} \sum_{a \in \aleph(v_l)}^{R}(F(i, \omega)) \cdot G(v_l), \text{ for } i = 1, 2, 3, ..., m \quad (6)$$

$G(v_l)$ is an apriori importance of word $v_l$, and could be, for example, a monotonically increasing function of the word length with zero weight for common words like "and", "or", "of", etc. An aliased signature generated according to the above will ensure that documents that use similar sentences with synonymous words will come together in the signature space, allowing the documents to be classified together.

As a further example, aliasing may be used in generating compressive sensing signatures for use in localization in cellular networks. Let datum $X=\{T_l,J_l\}_{l=1}^{S(X)}$ be the set of (TowerID, RSSI) pairs of all the S(X) cell towers seen by a handheld device at one point in time. A tower ID $T_l$ is an integer of 64 bits. The 16 least significant bits (LSB) correspond to a LAC field of the ID. Towers that are no more than a few hundred meters apart tend to differ only in these LAC bits. The RSSI is a positive real value in Watts indicative of the received signal strength. The aliased compressive sensing signature of X is given by:

$$Y_i = \sum_{l=1}^{S(X)} \sum_{t=T_l-3\sigma}^{T_l+3\sigma} R(f(i,t))\exp^{-\frac{(t-T_l)^2}{2\sigma^2}} \cdot J_l, \text{ for } i = 1, 2, 3, ..., m \quad (7)$$

In (7) above exp $$\exp^{-\frac{(t-T_l)^2}{2\sigma^2}}$$

is a Gaussian distribution which allocates maximum probability when variation is near its mean, and rapidly falling probabilities away from it. Accordingly, it allocates a large probability or similarity to tower ids near to $T_l$ as numbers, and small similarity elsewhere. $\sigma$ controls how fast the similarly measure falls off.

In the above, the fixed parameter $\sigma$ allows control of the synonymity between a tower ID $T_l$ and other tower IDs that are close to it on the integer line. This type of synonymity may be reasonable since, as described above, towers with close IDs usually also have close physical proximity. Setting $\sigma$ close to zero will remove the synonym property from the signature.

The methods 800, 900 and 1000 described above describe different possible implementations for calculating the compressed sensing signature vector with aliasing of synonyms. As will be appreciated, the methods 800, 900 and 1000 are not the only possible implementations for calculating the signa-ture vector. Other methods for calculating the signature vector are possible. However, regardless of the specific implementation for calculating the signature vector, it is calculated without requiring a measurement matrix. Advantageously, without requiring a measurement matrix for calculating the signature vector, it is possible to calculate the signature vector for data from a large dimension space using computing devices without requiring large amounts of memory.

Figure 11:
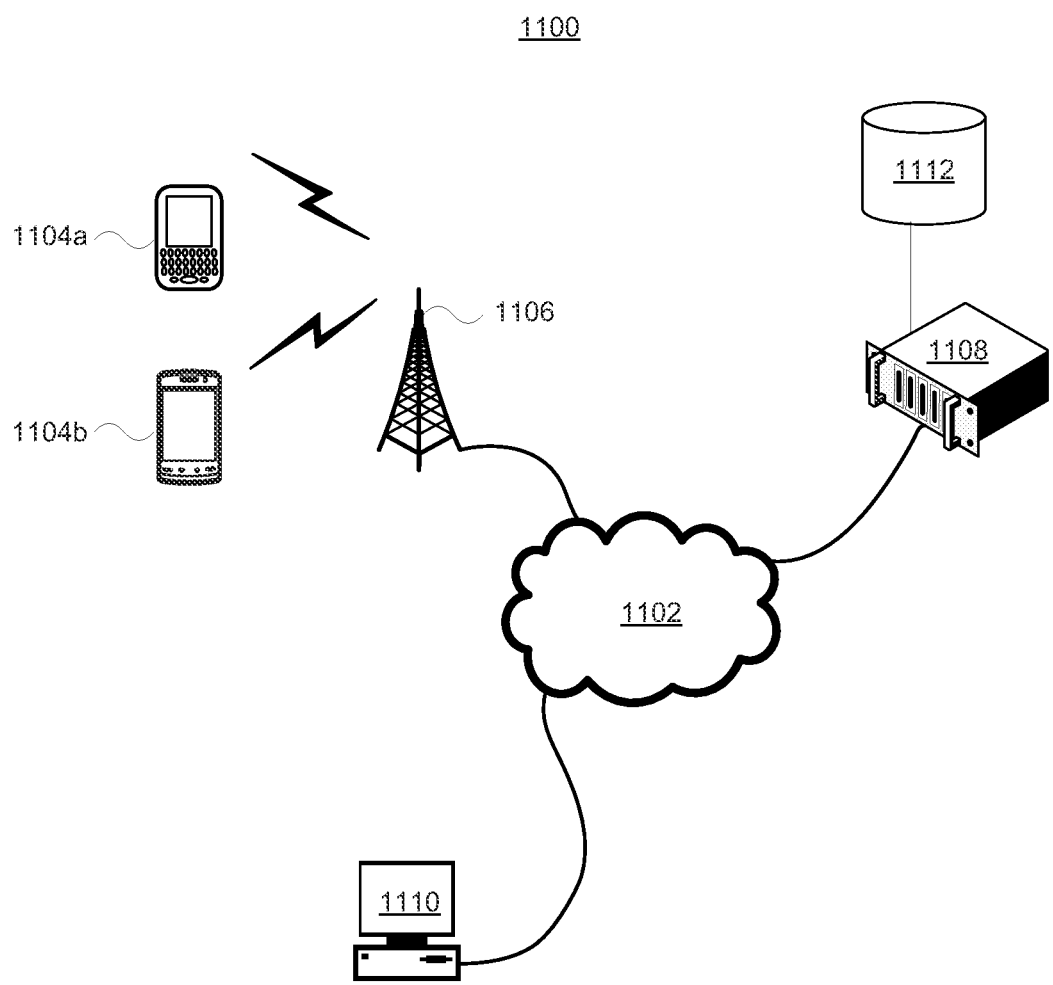
FIG. 11 depicts an environment in which generating a compressed sensing signature vector can be used.

FIG. 11 depicts an environment in which generating a compressed sensing signature vector can be used. The environment 1100 comprises a network 1102 connecting a plurality of devices together. The devices may include for example one or more mobile devices 1104a, 1104b, that are connected to the network 1102 through a cellular infrastructure 1106. The devices may further comprise one or more servers 1108 connected to the network. The devices may further comprise one or more personal computers 1110 connected to the network 1102. It will be appreciated that the environment 1100 is a simplified illustration of the possible devices, and other devices and/or components may be included in the environment. Due to the small memory footprint that is possible as a result of not using a large measurement matrix, it is possible to calculate a compressive sensing signature for high dimensional data on any of the devices 1104a, 1104b, 1108, 1110. Generated compressive sensing signatures may be provided to a computing device for further processing or comparison and may be compared to other compressive sensing signatures either stored locally on a device or accessible through the network to a storage device 1112, for example storage coupled to a server 1108. Synonym information may be stored on individual devices 1104a, 1104b and 1110 or at a central location for example storage 1112. In addition the processing of data may occur at one or more locations and on one or more devices. The data from which signatures are to be generated may be provided by devices or retrieved from one or more storage locations for processing by a device.

The compressive sensing signatures described above can be used to generate signatures of sparse data having very large dimensions. The compressive sensing signatures are universal, in that they do not depend on any structural properties, other than the sparsity, of the data, unlike other methods such as multi-dimensional scaling which need to do principal component analysis of the data. Further, the compressive sensing signatures described herein are simple to compute and do not require a large memory footprint to store a large measurement matrix as required by standard compressed sensing. As such, the calculation of the compressive sensing signatures is possible on many devices, including mobile devices such as smart phones, even for sparse data having large dimensionality.

The compressive sensing signatures described herein are also approximately homomorphic. That is, distances between data are preserved. That is, if the sparse data is considered a vector, then two vectors of sparse data that are close, will have compressed sensing signature vectors that are also close. As such, the compressed sensing signatures may be used directly for comparison purposes, without having to reconstruct the original sparse data. For example, compressed sensing signatures of text documents may be used to compare the similarity of documents.

The compressed sensing signature vectors may be used in numerous different applications for generating a signature of sparse data. For example, compressed sensing signatures may be used to generate a signature representation of the wireless networks that are 'visible' at a particular location. A mobile device such as a smart phone may detect wireless devices in its vicinity, and use the information to determine its location. The mobile device may determine the Media Access Control (MAC) address as well as an associated indication of the received signal strength (RSSI) of the networks within its vicinity. As will be appreciated this information may be considered as sparse data, since a vector representing this information may be viewed as a vector that uses the MAC address as the index and the signal strength as the associated element value. The sparse data vector would then have $2^{64}$ elements, that is one element for each possible MAC address. Nearly all of these elements will be zero. Only the elements associated with the MAC addresses that the mobile device can detect will have a value. However, if standard compressive sensing was used to compress this data into for example a vector having 32 elements, a measurement matrix of dimension $2^{64} \times 32$ would be required. Such a memory requirement is impractical, if not impossible. However, as described above, a compressed sensing signature could be generated without requiring the measurement matrix, making its application possible in the mobile device. Further, since the sparse radio scene data observed at physically proximate location tends to have a lot of overlap, that is similar towers are visible with similar signal strengths, and since the compressed sensing signatures are homomorphic, the compressive sensing signatures of such sparse data will also be close together, allowing them to be used directly for purposes of comparing or determining physical location.

Another possible application of compressed sensing signatures is for generating a signature of a text document. The generated signature may be used for classification of the document, identification of the document, or other purposes such as subsequent searching for the document. In generating a compressed sensing signature of a text document, the sparse data may be considered as a vector with elements corresponding to all possible unique words. The unique words themselves may be used as a key or index, or alternatively, a dictionary may be used to index all of the possible words. The value of each element in the sparse data vector may be, for example the frequency of occurrence of the associated word in the document being classified. The data will likely be sparse since the text document will likely only have a small subset of the total number of possible words in the dictionary. As such most of the elements in the sparse data vector will be zero. A set of key-value pairs may be generating by parsing the words in the text document and counting the number of occurrences of each unique word in the text document. The set of key-value pairs may comprise a key-value pair for each of the unique words in the document, or alternatively may comprise a key-value pair for each word in the document. Regardless of if the set of key-value pairs comprises repeated keys, a compressed sensing signature may be generated from the set as described above. The compressed sensing signature may be used to categorize the text document, comparing the text document to other documents, searching for the text document, etc.

The above has described generating a compressed sensing signature as a vector of a known size m. It is possible to take the sign of the value of each element of signature to provide a binary signature. The resulting signature in $\{-1,+1\}^m$ is also an approximately homomorphic representation under the Hamming distance. Such a binary signature may be useful if the signature is to be used as an input to machine learning algorithms that expect discrete valued data. The binary valued signature may be considered as providing a robust universal quantization of real vectors.

Figure 12:
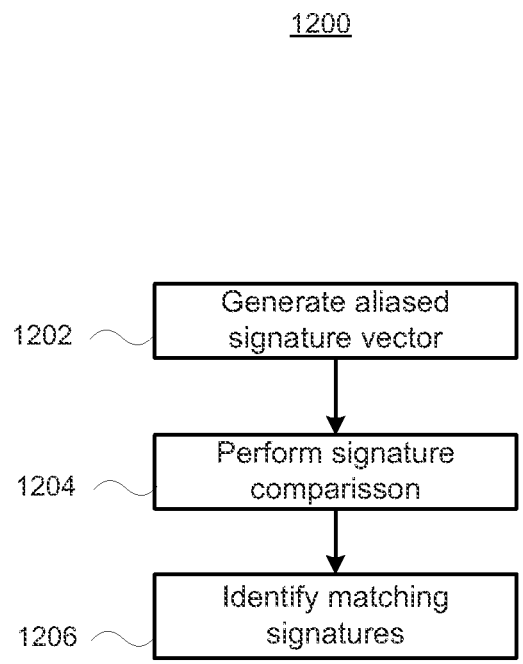
FIG. 12 depicts a method of comparing two signatures.

FIG. 12 depicts a method of comparing signatures. By comparing the closeness of signatures, various functionality may be provided, such as determining a location, matching input to a corpus, classifying documents, etc. The method may receive data representable by a plurality of key-value pairs each comprising a unique identifier and an associated non-zero value of n-dimensional data, at least one of the plurality of key-value pairs associated with synonym information, as described above, which may be performed on the device performing method 1200 or on one or more remote devices coupled through a network. Once the key-value pairs are accessed, the elements of the m-dimensional aliased signature vector are generated (1202), for example using one or more of the methods described above. Once the compressive sensing signature vector is generated, a comparison between the generated signature and one or more other compressive sensing signatures is performed (1204). Signatures that match, or a similar to, the generated signature can then be identified (1206). The signatures used in the comparison may be received from another device, or they may be retrieved from previously stored signatures either stored locally on the device generating the signature vector or accessible through a network. For example, a search signature may be submitted, and used to retrieve documents associated with signatures that are determined to be close to the search signature.

The comparison between two signatures may be provided by the Euclidean distance between the two, which captures "difference" between the two signatures. Alternatively, the comparison may be made using the standard Inner Product, which captures the similarity between the two signatures. Devices typically provide efficient implementations of math libraries for determining either the Euclidean distance or the inner product. However, it may be necessary to compare a candidate signature with a large number of pre-recorded signature vectors. Hence, it is desirable to use some computationally efficient way for finding the closest signature from a corpus of signatures, given some candidate signature. One illustrative way to do this is to first construct a vantage point tree (VP Tree) data structure from the corpus of signatures. Suppose the corpus had W signatures in it, where W can be a very large number, for example corresponding to hundreds of thousands of emails or documents, or millions of recorded radio scenes. The computational cost of construction of the VP Tree is O(W). Then when a candidate signature, for example from a document or radio scene is presented, the VP Tree can return the nearest K neighbours from the corpus of signatures, with a computational cost that is only O(K log N), which may be acceptable cheap since it is independent of W.

It is noted that the above described method of comparing two signatures is only one possible method of using the signatures. For example, a plurality of signatures may be formed into clusters to group similar information together. A search signature may then be used to determine the closest cluster and return the information associated with the determined cluster.

It is contemplated that the synonym and synonym weighting value of a particular element may be determined from the element using a formula as opposed to retrieving the information from a data structure.

As described above, it is possible to generate compressive sensing signatures that provide aliasing across synonyms. Although a limited number of illustrative applications were described, it will be appreciated that aliased compressive sensing signatures may be used in a wide range of applications. In some embodiments, any suitable computer readable media can be used for storing instructions for performing the processes described herein. For example, in some embodiments, computer readable media can be transitory or non-transitory. For example, non-transitory computer readable media can include media such as magnetic media (such as hard disks, floppy disks, etc.), optical media (such as compact discs, digital video discs, Blu-ray discs, etc.), semiconductor media (such as flash memory, electrically programmable read only memory (EPROM), electrically erasable programmable read only memory (EEPROM), etc.), any suitable media that is not fleeting or devoid of any semblance of permanence during transmission, and/or any suitable tangible media. As another example, transitory computer readable media can include signals on networks, in wires, conductors, optical fibers, circuits, any suitable media that is fleeting and devoid of any semblance of permanence during transmission, and/or any suitable intangible media.

Although the description discloses example methods, system and apparatus including, among other components, software executed on hardware, it should be noted that such methods and apparatus are merely illustrative and should not be considered as limiting. For example, it is contemplated that any or all of these hardware and software components could be embodied exclusively in hardware, exclusively in software, exclusively in firmware, or in any combination of hardware, software, and/or firmware. Accordingly, while the following describes example methods and apparatus, persons having ordinary skill in the art will readily appreciate that the examples provided are not the only way to implement such methods and apparatus.

What is claimed is:

1. A method for generating, in a computing device, an m-dimensional aliased signature vector comprising m vector elements, the method comprising:

accessing a plurality of key-value pairs, each comprising a respective key, corresponding to one of n unique identifiers, and a non-zero value, at least one of the keys being associated with one or more synonymous unique identifiers from the n unique identifiers; and calculating each vector element based on a summation of a plurality of terms, each term calculated from a respective key-value pair, when the key of the respective key-value pair is associated one or more synonymous unique identifiers, the term calculated by adding one or more sub-terms, each calculated from a respective synonymous unique identifier of the one or more synonymous unique identifiers associated with the key of the respective key-value pair by:

generating a synonym seed based on the respective synonymous unique identifier and the element identifier associated with the vector element being calculated;

generating a synonym pseudo-random number from the generated synonym seed; and multiplying the synonym pseudo-random number by the value of the respective key-value pair, wherein $m \gg n$.

2. The method of claim 1 wherein when the key of the key-value pair is not associated with one or more synonymous unique identifiers, the term calculated by:

generating a seed based on the key of the respective key-value pair and an element identifier associated with the vector element being calculated;

generating a pseudo-random number from the generated seed; and multiplying the pseudo-random number by the value of the respective key-value pair.

3. The method of claim 1, wherein synonym information associates a plurality of synonymous unique identifiers together, and a key of the key-value pairs is associated with synonymous unique identifiers if the key matches one of the synonymous unique identifiers.

4. The method of claim 3, wherein the synonym information is stored as one or more of:

a synonym matrix;

a plurality of tuples of synonymous unique identifiers; or a list of lists of synonymous unique identifiers.

5. The method of claim 3, wherein the synonym information is a formula used to determine a similarity between two or more synonymous unique identifiers.

6. The method of claim 3, wherein the synonym information further associates with the synonymous unique identifiers, a synonym weighting value indicating a degree of similarity between synonymous unique identifiers.

7. The method of claim 6, wherein when the key of the respective key-value pair is associated with one or more synonymous unique identifiers, the term calculated by further:

normalizing the term by dividing the term by the sum of the synonym weighting values associated with the synonymous unique identifiers associated with the key of the key-value pair.

8. The method of claim 1, wherein when the key of the respective key-value pair is associated with one or more synonymous unique identifiers, the term calculated by further:

normalizing the term by dividing by the number of synonymous unique identifiers associated with the key of the key-value pair.

9. The method of claim 1, wherein no two key-value pairs have the same key.

10. The method of claim 1, wherein generating each of the elements further comprises weighting each of the terms based on a weighting value for the key associated with the respective term.

11. The method of claim 1, wherein the key-value pairs include at least two key-value pairs having the same key.

12. The method of claim 1, wherein the signature is computed incrementally in a single pass, by progressively processing key-value pairs until it is fully consumed.

13. The method of claim 1, further comprising:

storing the m-dimensional signature vector in memory; and comparing the m-dimensional signature vector to one or more previously generated m-dimensional signature vectors.

14. A computing device for generating an m-dimensional aliased signature vector, the device comprising:

a memory containing instructions; and a processor for executing instructions, the instructions when executed by the processor configuring the device to provide functionality for:

accessing a plurality of key-value pairs, each comprising a respective key, corresponding to one of n unique identifiers, and a non-zero value, at least one of the keys being associated with one or more synonymous unique identifiers from the n unique identifiers; and calculating each vector element based on a summation of a plurality of terms, each term calculated from a respective key-value pair, when the key of the respective key-value pair is associated one or more synonymous unique identifiers, the term calculated by adding one or more sub-terms, each calculated from a respective synonymous unique identifier of the one or more synonymous unique identifiers associated with the key of the respective key-value pair by:

generating a synonym seed based on the respective synonymous unique identifier and the element identifier associated with the vector element being calculated;

generating a synonym pseudo-random number from the generated synonym seed; and multiplying the synonym pseudo-random number by the value of the respective key-value pair, wherein m>>n.

15. The computing device of claim 14, wherein when the key of the key-value pair is not associated with one or more synonymous unique identifiers, the term calculated by:

generating a seed based on the key of the respective key-value pair and an element identifier associated with the vector element being calculated;

generating a pseudo-random number from the generated seed; and multiplying the pseudo-random number by the value of the respective key-value pair.

16. The computing device of claim 14, wherein synonym information associates a plurality of synonymous unique identifiers together, and a key of the key-value pairs is associated with synonymous unique identifiers if the key matches one of the synonymous unique identifiers.

17. The computing device of claim 16, wherein the synonym information is stored as one or more of:

a synonym matrix;

a plurality of tuples of synonymous unique identifiers; or a list of lists of synonymous unique identifiers.

18. The computing device of claim 17, wherein the synonym information is a formula used to determine a similarity between two or more synonymous unique identifiers.

19. The computing device of claim 17, wherein the synonym information further associates with the synonymous unique identifiers, a synonym weighting value indicating a degree of similarity between synonymous unique identifiers.

20. The computing device of claim 19, wherein when the key of the respective key-value pair is associated with one or more synonymous unique identifiers, the term calculated by further:

normalizing the term by dividing the term by the sum of the synonym weighting values associated with the synonymous unique identifiers associated with the key of the key-value pair.

21. The computing device of claim 14, wherein when the key of the respective key-value pair is associated with one or more synonymous unique identifiers, the term calculated by further:

normalizing the term by dividing by the number of synonymous unique identifiers associated with the key of the key-value pair.

22. The computing device of claim 14, wherein no two key-value pairs have the same key.

23. The computing device of claim 14, wherein generating each of the elements further comprises weighting each of the terms based on a weighting value for the key associated with the respective term.

24. The computing device of claim 14, wherein the key-value pairs include at least two key-value pairs having the same key.

25. The computing device of claim 14, wherein the signature is computed incrementally in a single pass, by progressively processing key-value pairs until it is fully consumed.

26. The computing device of claims 14, further comprising:

storing the m-dimensional signature vector in memory; and comparing the m-dimensional signature vector to one or more previously generated m-dimensional signature vectors.

27. A non-transitory computer readable memory containing instructions for generating an m-dimensional signature vector comprising m vector elements, the instructions which when executed by a processor perform the method of:

accessing a plurality of key-value pairs, each comprising a respective key, corresponding to one of n unique identifiers, and a non-zero value, at least one of the keys being associated with one or more synonymous unique identifiers from the n unique identifiers; and calculating each vector element based on a summation of a plurality of terms, each term calculated from a respective key-value pair, when the key of the respective key-value pair is associated one or more synonymous unique identifiers, the term calculated by adding one or more sub-terms, each calculated from a respective synonymous unique identifier of the one or more synonymous unique identifiers associated with the key of the respective key-value pair by:

generating a synonym seed based on the respective synonymous unique identifier and the element identifier associated with the vector element being calculated;

generating a synonym pseudo-random number from the generated synonym seed; and multiplying the synonym pseudo-random number by the value of the respective key-value pair, wherein m>>n.

* * * * *